(12) United States Patent
Yang et al.

(10) Patent No.: US 7,514,370 B2
(45) Date of Patent: Apr. 7, 2009

(54) COMPRESSIVE NITRIDE FILM AND METHOD OF MANUFACTURING THEREOF

(75) Inventors: Daewon Yang, Hopewell Jct., NY (US); Woo-Hyeong Lee, Poughquag, NY (US); Tai-chi Su, Woodbury, CT (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 11/419,217

(22) Filed: May 19, 2006

(65) Prior Publication Data

US 2007/0269992 A1 Nov. 22, 2007

(51) Int. Cl.
H01L 21/31 (2006.01)
H01L 21/469 (2006.01)

(52) U.S. Cl. .................. 438/758; 438/197; 438/791

(58) Field of Classification Search ........... 438/197, 438/199, 202, 758, 791
See application file for complete search history.

(56) References Cited

U.S. PATENT DOCUMENTS

| | | | |
|---|---|---|---|
| 6,171,917 B1 | 1/2001 | Sun et al. | |
| 6,217,721 B1 | 4/2001 | Xu et al. | |
| 6,372,291 B1 | 4/2002 | Hua et al. | |
| 6,426,272 B1 | 7/2002 | Fu et al. | |
| 6,472,307 B1 | 10/2002 | Dennis et al. | |
| 6,521,518 B1 | 2/2003 | Chiu et al. | |
| 6,531,412 B2 | 3/2003 | Conti et al. | |
| 6,670,717 B2 | 12/2003 | Kane et al. | |
| 6,806,165 B1 | 10/2004 | Hopper et al. | |
| 6,858,530 B2 | 2/2005 | Kane et al. | |
| 7,205,240 B2 * | 4/2007 | Karim et al. | ............ 438/694 |
| 2003/0071361 A1 | 4/2003 | Kane et al. | |
| 2004/0089952 A1 | 5/2004 | Kane et al. | |
| 2004/0113217 A1 | 6/2004 | Chidambarrao et al. | |
| 2004/0152251 A1 | 8/2004 | Shin | |
| 2005/0040460 A1 | 2/2005 | Chidambarrao et al. | |
| 2005/0158955 A1 | 7/2005 | Yang et al. | |
| 2005/0189589 A1 | 9/2005 | Zhu et al. | |
| 2005/0260806 A1 | 11/2005 | Chang et al. | |
| 2005/0287747 A1 | 12/2005 | Chakravarti et al. | |
| 2007/0007548 A1 * | 1/2007 | Conti et al. | ............ 257/202 |

FOREIGN PATENT DOCUMENTS

EP 0799903 10/1997

OTHER PUBLICATIONS

"Method of Forming Nitride Films With High Compressive Stress for Improved PFET Device Performance" (U.S. Appl. No. 11/160,705).

(Continued)

Primary Examiner—Phuc T Dang
(74) Attorney, Agent, or Firm—Yuanmin Cai

(57) ABSTRACT

Embodiments of the invention provide a method of forming a compressive stress nitride film overlying a plurality of p-type field effect transistor gate structures produced on a substrate through a high-density plasma deposition process. Embodiments include generating an environment filled with high-density plasma using source gases of at least silane, argon and nitrogen; biasing the substrate to a high frequency power of varying density, in a range between 0.8 W/cm$^2$ and 5.0 W/cm$^2$; and depositing the high-density plasma to the plurality of gate structures to form the compressive stress nitride film.

5 Claims, 7 Drawing Sheets

OTHER PUBLICATIONS

"HDP/PECVD Methods of Fabricating Stress Nitride Structures For Field Effect Transistors, and Field Effect Transistors So Fabricated" (U.S. Appl. No. 11/264,865).

International Search Report and the Written Opinion for FIS920060068.

* cited by examiner

COMPRESSIVE NITRIDE FILM AND METHOD OF MANUFACTURING THEREOF

FIELD OF THE INVENTION

The present invention relates to the manufacture of semiconductor devices. In particular, it relates to forming nitride films covering field effect transistors to improve mobility of electronic charges or holes therein.

BACKGROUND OF THE INVENTION

In the field of design and manufacture of semiconductor devices, it is well known in the art that mechanical stresses in a substrate of a device may affect performances of the device, and stress engineering plays an important role in improving device performances. For example, during the manufacture of a field effect transistor (FET), such as a complementary metal-oxide-semiconductor (CMOS) FET device, stresses are generally applied to a channel region in the substrate of the device so as to improve mobility of electrons or holes therein. The mobility of electrons or holes in turn may increase an operational speed of the device, among other things. As is also known in the art, stresses are generally applied and/or engineered differently toward devices of different types. For example, the applied stress may be different depending on whether a device is a p-type FET (PFET) device or an n-type FET (NFET) device.

As far as a PFET device, for example a PFET gate, is concerned, it is common to design a longitudinal compressive stress into a channel region in the substrate under a gate area of the device. As an alternative, a nitride film or layer of nitride film may be deposited on top of and covering the PFET device. The deposited nitride film, due to its high intrinsic compressive stress, may externally induce stresses into the targeted channel region of the device such that a similar stress level may be achieved. The compressive nitride film or layer of nitride film may be formed through, for example, a deposition process such as a plasma-enhanced chemical vapor deposition (PECVD) process, and the film formed is usually conformal in shape.

As is also known in the art, during nitride film deposition through PECVD process, pinch-offs may occur around an upper section of the film deposited. The pinch-offs may cause voids to be created inside and/or underneath the film, which may inadvertently become leakage paths, during a subsequent metallization process, between closely spaced FET gates underneath the film. Although the formation of the leakage paths may be, to some extent, mediated through an improved process known as a modified reactive ion etching (RIE), which is described below in detail, aggressive scaling in device size in the semiconductor industry and increased complexity of device processing may continue to reduce and/or eventually eliminate any effectiveness and/or efficiency that this modified RIE may currently have in preventing the formation of pinch-offs, voids, and/or leakage paths. In addition to "void" as described above, deposition of nitride film through a PECVD process may also cause the forming of "tunnels" in a nested poly-contact (PC) structure around areas where source and/or drain interfaces with gate of the device. Similar to voids due to pinch-offs, "tunnels" may be filled with metal elements in a subsequent metallization process to become leakages or short paths as well. The leakages or short paths between different areas or regions of a semiconductor device may cause degradation of device performances and/or total failure of the device.

Also known in the art is a high-density plasma (HDP) deposition process that may be applied in producing compressive nitride films covering PFET devices. The HDP nitride process has been used in depositing copper (Cu) cap layers associated with a back end of the line (BEOL) technology. The HDP process typically uses a low frequency (LF), for example about 400 kHz, power source to generate an environment filled with plasma. The plasma is then deposited onto the surface of semiconductor devices to form a film. The semiconductor devices are generally biased. For example, to create a nitride film of compressive stress, the semiconductor devices on a substrate of 300 mm wafer may be biased at a fixed power around 400 W, which is equivalent to a fixed power density of about 0.5 W/cm$^2$. The power source is typically a high frequency (HF) power source at around 13.56 MHz. It has been shown experimentally that the fixed bias power density, at 0.5 W/cm$^2$ for example, may create a highly compressive nitride film with a stress level as high as −3100 MPa. However, it is also known in the art that a nitride film formed under this fixed bias condition for the purpose of generating very high stress level may also create "seams" around such regions as, for example, interfacing regions between a gate and spacers around the gate, wherearound the underlying gate structure may exhibit a nominal structural changes. In addition, the HDP deposition process, which is aimed for creating highly compressive nitride film, also generates voids caused by pinch-offs as described above with regard to the PECVD process.

BRIEF DESCRIPTION OF THE DRAWINGS

The present invention will be understood and appreciated more fully from the following detailed description of the invention, taken in conjunction with the accompanying drawings of which.

Figure 1:
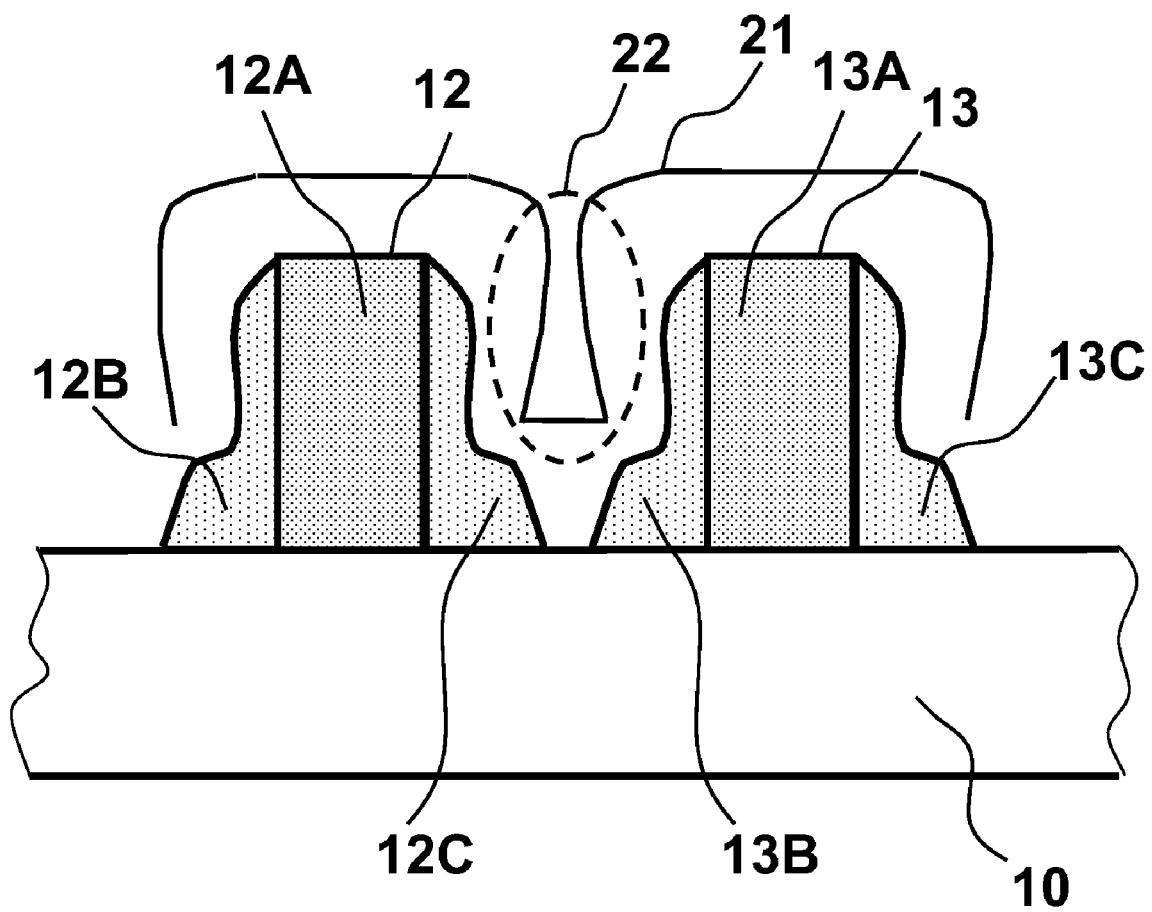
FIG. 1 is a schematic illustration of two PFET gates covered by a compressive nitride film formed following a conventional method.

It will be appreciated that for simplicity and clarity of illustration, elements shown in the drawings have not necessarily been drawn to scale. For example, the dimensions of some of the elements may be exaggerated relative to other elements for clarity.

SUMMARY OF THE INVENTION

Embodiments of the invention provide a method of forming a layer of compressive nitride film over at least one gate structure on a substrate. The method may include generating a high-density plasma using at least silane, argon and nitrogen gases; biasing the substrate to a high frequency power density of at least 0.8 W/cm2; and depositing the high-density plasma on top of the gate structure to form the layer of compressive nitride film.

Embodiments of the invention may also provide a method of forming a layer of compressive nitride film over a first and a second gate structures on a substrate. The method may include forming the layer of compressive nitride film in between the first gate structure and a second gate structure.

According to one embodiment, the method may include forming the layer of compressive nitride film to have a thickness, measured at a mid-point between the first and second gate structures, of at least half of a distance between the first and second gate structures.

According to another embodiment, the distance between the first and second gate structures is less than one and half of a size of the first and second gate structures.

According to yet another embodiment, the method may include biasing the substrate to a power of varying density to adjust the thickness of the layer of compressive nitride film formed between the first and second gate structures. For example, the method may include adjusting the power density biased to the substrate to reach a pre-determined aspect ratio between distances of peak to valley and peak to peak of the layer of compressive nitride film.

According to one embodiment, the method may include maintaining a temperature of the substrate between 375° C. and 440° C., preferably between 400° C. and 420° C., during deposition of the high-density plasma. According to another embodiment, the method may include maintaining a combined pressure of the silane, argon and nitrogen gases at less than 10 mTorr during deposition of said high-density plasma. According to yet another embodiment, the method may include maintaining a ratio of argon and nitrogen gases between 0.5 and 1.0 during deposition of the high-density plasma.

According to one embodiment, the method may include biasing the substrate to a high frequency power having a frequency of between 12 MHz and 15 MHz, and preferably at about 13.56 MHz.

Embodiments of the invention provide a method of making a semiconductor device containing a plurality of field effect transistors. The method may include forming gate structures of the field effect transistors on a substrate; placing the substrate in an environment filled with high-density plasma; applying a bias power of at least 0.8 W/cm2 in power density to the substrate; and generating a layer of compressive nitride film on top of the field effect transistors formed on the substrate using the high-density plasma.

According to one embodiment, the substrate may be a 300 mm wafer and the method may include applying a bias power of at least 600 W to the substrate to create the layer of compressive nitride film. According to another embodiment, the substrate may be a 200 mm wafer and the method may include applying a bias power of at least 250 W to the substrate to create the layer of compressive nitride film.

Embodiments of the invention provide a semiconductor device having at least two adjacent gate structures of field effect transistors; and a compressive nitride film on top of the adjacent gate structures, wherein the compressive nitride film has a thickness that is higher at between than at the sides of the gate structures.

According to one embodiment, the two adjacent gate structures are apart by a distance less than twice of the thickness of said nitride film. According to another embodiment, a ratio between a height of at least one of the gate structures and a thickness of the nitride film is greater than one.

According to one embodiment, the nitride film has a compressive stress of at least −2000 MPa. According to another embodiment, the nitride film has a compressive stress of at least −2500 MPa. According to yet another embodiment, the field effect transistor may be a p-type field effect transistor, and preferably a complementary metal-oxide semiconductor (CMOS) p-type field effect transistor.

Embodiments of the invention provide a method of forming a compressive stress nitride film. The method may include creating a plurality of gate structures of p-type field effect transistors on a substrate; placing the gate structures inside a high-density plasma environment; applying a high frequency bias power of varying densities to said substrate; and depositing the high-density plasma to form the compressive stress nitride film covering the gate structures.

In accordance to one embodiment, the method may include varying the bias power from 0.8 W/cm2 to 5.0 W/cm2 during high-density plasma deposition to form the compressive stress nitride film void-free. The void-free compressive stress nitride film may be formed in between the plurality of gate structures.

In accordance to another embodiment, the method may include creating a surface topography of the compressive stress nitride film that is adapted to subsequent film deposition processes, for example, a "V" shape that is gap-fill friendly.

In accordance to yet another embodiment, the method may include forming the compressive stress nitride film at a higher rate in a dense poly-contact area between the two adjacent gate structures than in large open areas at the sides of the gate structures.

DETAILED DESCRIPTION OF THE INVENTION

FIG. 1 is a schematic illustration of two gate devices, e.g., PFET gate devices, covered by a compressive nitride film. The compressive nitride film may be created, fabricated or produced through one or more well known conventional processes such as, for example, a PECVD process. At least one of the gate devices may have spacers formed at the sides of a gate region. As is illustrated in FIG. 1, PFET gate devices 12 and 13 may be created, fabricated, or produced on top of a semiconductor substrate 10. Spacers 12B and 12C may be formed at the sides of a gate region 12A of gate device 12 and spacers 13B and 13C may be formed at the sides of a gate region 13A of gate device 13. As is known in the art, spacers may be formed or created to protect a gate region of a gate device from becoming in direct contact with source/drain regions, which may be created through an ion implantation process in the substrate, of the gate device.

In order to enhance performance such as, for example, speed of gate devices 12 and/or 13, stresses may be created in respective channel regions of gate devices 12 and/or 13, inside substrate 10, to increase mobility of electric charges and/or holes underneath the respective gate regions or areas 12A and/or 13A. The stress inside substrate 10 may be induced through a compressive nitride film or layer of compressive nitride film 21 which may be created, formed, or deposited on top of gate devices 12 and/or 13. The deposition or creation of compressive nitride film 21 may be through a plasma-enhanced chemical vapor deposition (PECVD) process.

As is known in the art, a PECVD process may create or form a film that is conformal to the structure upon which it is formed or created. As a result, pinch-offs may occur in regions, such as a region 22 around the upper section of film 21 as shown in FIG. 1, in situations where the two PFET gate devices 12 and 13 are closely or narrowly spaced. This may be due to the fact that a growth rate of nitride film around areas in the top corner region 22 is generally faster than that at the sidewall and bottom of the spacing between gate devices 12 and 13. As a result, a void may form underneath the pinch-off, which may inadvertently develop into a leakage path, for example, during a subsequent metallization process by allowing metal elements used in the process to be filled therein. The leakage path may create shortages among different, otherwise independent, gate devices, lead to possible device failure, and consequently cause a yield reduction in the manufacture of the device.

Figure 2:
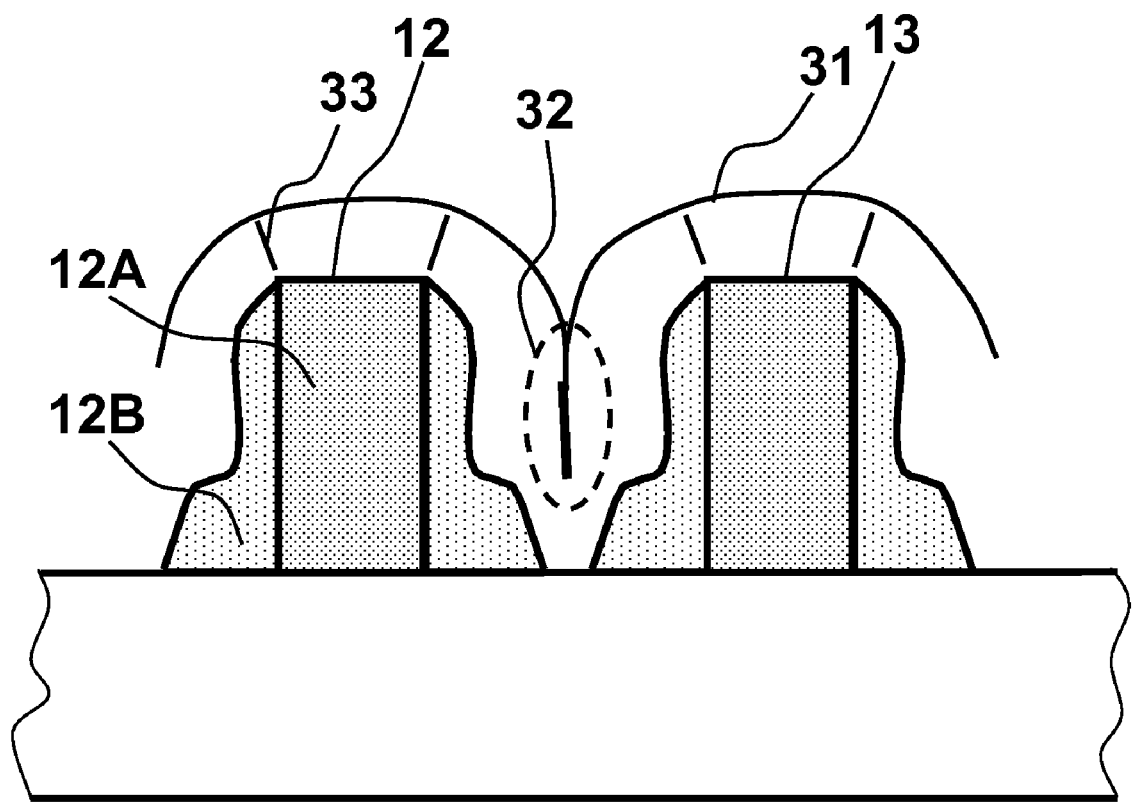
FIG. 2 is a schematic illustration of two PFET gates covered by a compressive nitride film formed following another conventional method.

FIG. 2 is a schematic illustration of two PFET gate devices covered by a compressive nitride film created or formed through another conventional process or method. A compressive nitride film or layer of compressive nitride film 31 may be created, formed, or fabricated through a conventional high-density plasma (HDP) deposition process which has been commonly used in copper (Cu) cap deposition associated with a BEOL technology. The formation of nitride film 31 may include the use of a high frequency (HF) bias power at a typically fixed power density of, for example, 0.5 W/cm$^2$, around which a highly compressive stress may be built into the formed nitride film. As is known in the art, the high-density plasma or plasma environment used in the deposition process may be generated or produced by a low frequency (LF) main power around, for example, 1500 W to 4000 W. The frequency of the main power may be around 400 kHz.

As is described above, when a nitride film is created or formed using a high frequency bias power fixed at around 0.5 W/cm$^2$ power density, high compressive stresses may be introduced or generated in the film produced. However, in some high aspect ratio regions such as region or trench area 32 between closely spaced gate devices 12 and 13 as shown in FIG. 2, pinch-offs and subsequently voids may occur, similar to a film produced by a PECVD process, because growth rate of the nitride film is generally faster at a top areas than at a bottom inside of the trench region or area 32. In addition to the formation of pinch-offs and/or voids, seams may also build up, as have been observed experimentally, around regions or areas where a gate device underneath exhibits noticeable structural changes. For example, seam 33 may build up around a region where gate region 12A of gate device 12 may interfaces with its spacer 12B, as illustrated in FIG. 2.

Figure 3:
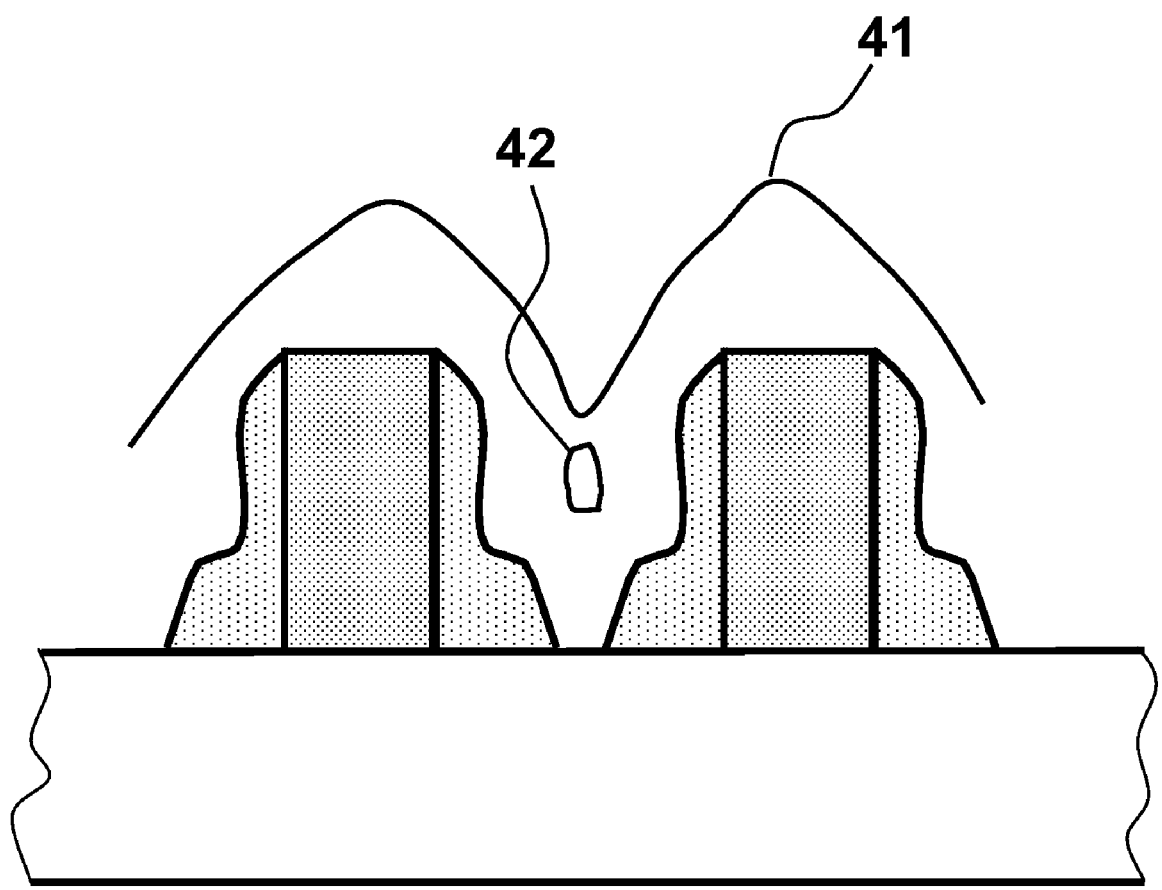
FIG. 3 is a schematic illustration of two PFET gates covered by a compressive nitride film formed following yet another conventional method.

FIG. 3 is a schematic illustration of two PFET gate devices covered by a compressive nitride film created or formed through yet another conventional process or method. A compressive nitride film 41 may be created or formed through a modified reactive ion etching (RIE) process which may be a process of repeated cycles of deposition and etching. Despite the increased complexity of the modified RIE process, pinch-offs may still occur or be created in regions or areas between closely spaced gate devices. For example in one illustrative experiment of forming a nitride film 41 with a target thickness of 1130 Å, pinch-off 42 was observed to start forming when the layer of nitride film 41 deposited in a single deposition step was only around 500 Å. Therefore, in order to avoid possible formation of pinch-offs, the thickness of nitride film that may be deposited in a single deposition step may need to be much thinner than 500 Å and, for example, may need to be reduced substantially to around, e.g., 200~300 Å. Consequently, four (4) to five (5) cycles of deposition and etching may be required in order to reach the targeted film thickness of 1130 Å. In other words, the number of deposition-etching-deposition cycle may need to increase significantly in order to reduce the chance and/or possibly eliminate the formation of pinch-offs. It is known in the art that any increase in the number of cycles (deposition, etching, and deposition, etc.) may significantly increase the complexity of process control, lead to less process windows, longer processing time, and higher cost of manufacture, and therefore is generally not desirable.

Figure 4:
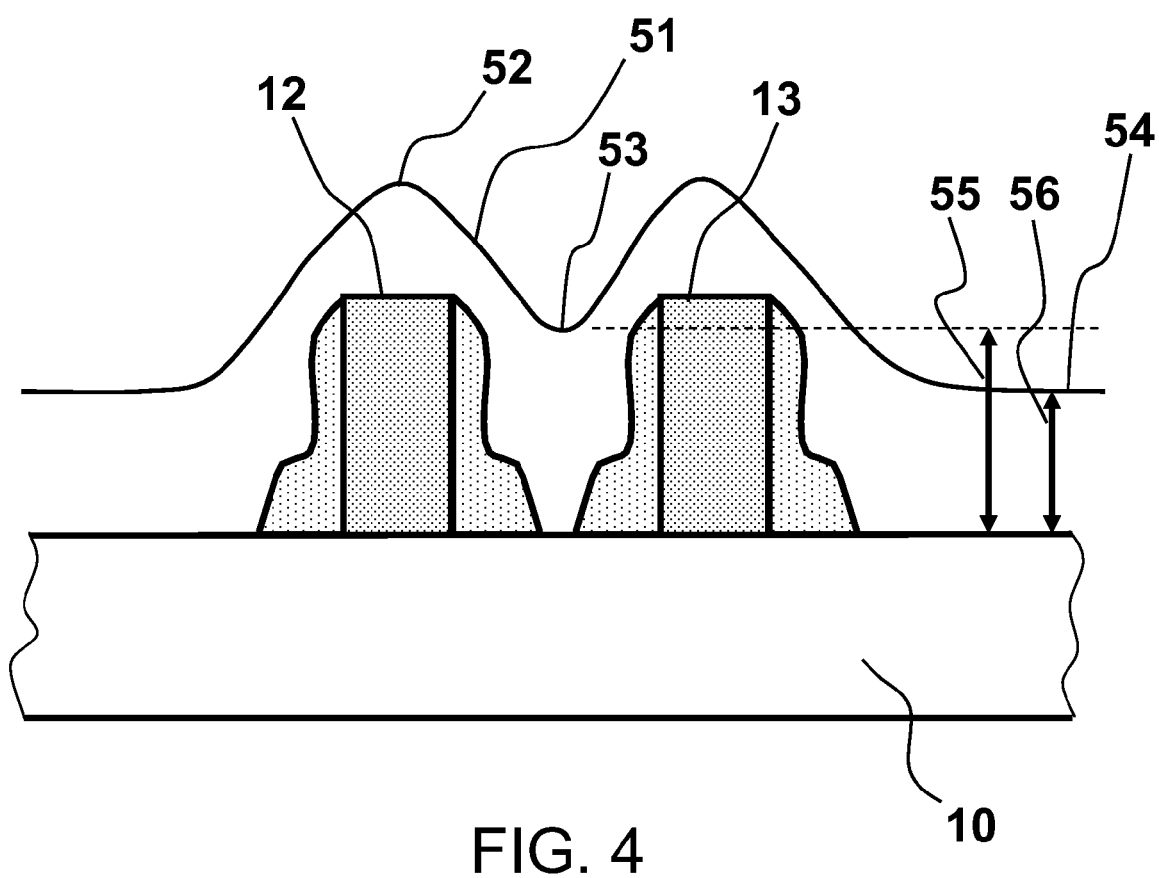
FIG. 4 is a schematic illustration of two PFET gates covered by a compressive nitride film formed according to one embodiment of the invention.

FIG. 4 is a schematic illustration of two PFET gate devices covered by a compressive nitride film according to one embodiment of the invention. It will be appreciated by a person skilled in the art that the invention is not limited in this respect and other numbers of gate devices, for example one, four, or eight gate devices, may be used.

As is shown in FIG. 4, PFET gate devices or gate structures 12 and/or 13 may be created, produced, or fabricated on a semiconductor substrate 10. Gate devices 12 and/or 13 may be covered by a compressive nitride film or layer of compressive nitride film 51 deposited or formed through an HDP deposition process. According to one embodiment of the invention, during the deposition or formation of compressive nitride film 51, substrate 10 may be biased at a HF bias power that has a greater power density than the conventional 0.5 W/cm$^2$ (400 W for a 300 mm wafer). For example, in one embodiment, a bias power density of at least 0.8 W/cm$^2$ may be used. In another embodiment, a bias power density in a range between 0.8 W/cm$^2$ and 5.0 W/cm$^2$ may be used. A power density range between 0.8 W/cm$^2$ and 5.0 W/cm$^2$ corresponds to a power between about 600 W and about 3600 W for a 300 mm substrate, and between about 250 W and about 1600 W for a 200 mm substrate.

According to one embodiment, the bias power may vary or be adjusted during the deposition process of a nitride film, changing from low to high or from high to low depending on the particular profile of the nitride film to be formed. For example, a deposition process for a 300 mm substrate may start out with a bias power at around 900 W (1.3 W/cm$^2$) and gradually increase the power to about 1500 W (2.1 W/cm$^2$). This variation of bias power may allow the creation of a relatively high compressive stress in the nitride film formed, and at the same time avoid the formation of possible voids and seams. The relatively high bias power, between 900 W and 1500 W for example, provides sufficient energy for molecules of nitride film at near top corner or region of the gate structures to move across the film to fill in gaps between neighboring gate structures. For example, as illustrated in FIG. 4, molecules may move from a region 52 near the top of gate structure 12 to a region 53 between gate structures 12 and 13 to form a smooth, void-free and/or pinch-off-free nitride film 51. Similarly, molecules bombarded by the high-density plasma into a substrate biased at a sufficiently high power density (higher than 600 W for a 300 mm substrate or 250 W for a 200 mm substrate) are less likely to cluster around regions where a gate region interfaces with its spacers, and therefore may form a seamless film that covers across multiple gate structures or devices.

According to one embodiment, a thickness of a nitride film deposited between neighboring gate devices, e.g., at region 53 between gate devices 12 and 13, may be adjusted. The adjustment may be through controlling the HF bias power applied to substrate 10 during the HDP deposition process. The deposition rate or growth rate of a nitride film in a region between neighboring gate devices, such as region 53 ("closed region"), may be different from that in a region not surrounded by and is away from the gate devices, such as region 54 ("open region"). According to one embodiment, a nitride film may be deposited faster in a closed region than in an open region and the difference in the resulting film thicknesses may be quantified by a parameter, referred to hereinafter as "R". Parameter R may be a ratio of thickness 55 (of film at close region 53) over thickness 56 (of film at open region 54). According to one embodiment, parameter R may be designed or engineered to have a value larger than one (1), therefore realizing higher stress in a closed region through a thicker film. For example, the larger than one (1) thickness ratio R may be achieved through adjusting the bias power applied to substrate 10 during the deposition process of high density plasma (HDP).

Figure 5:
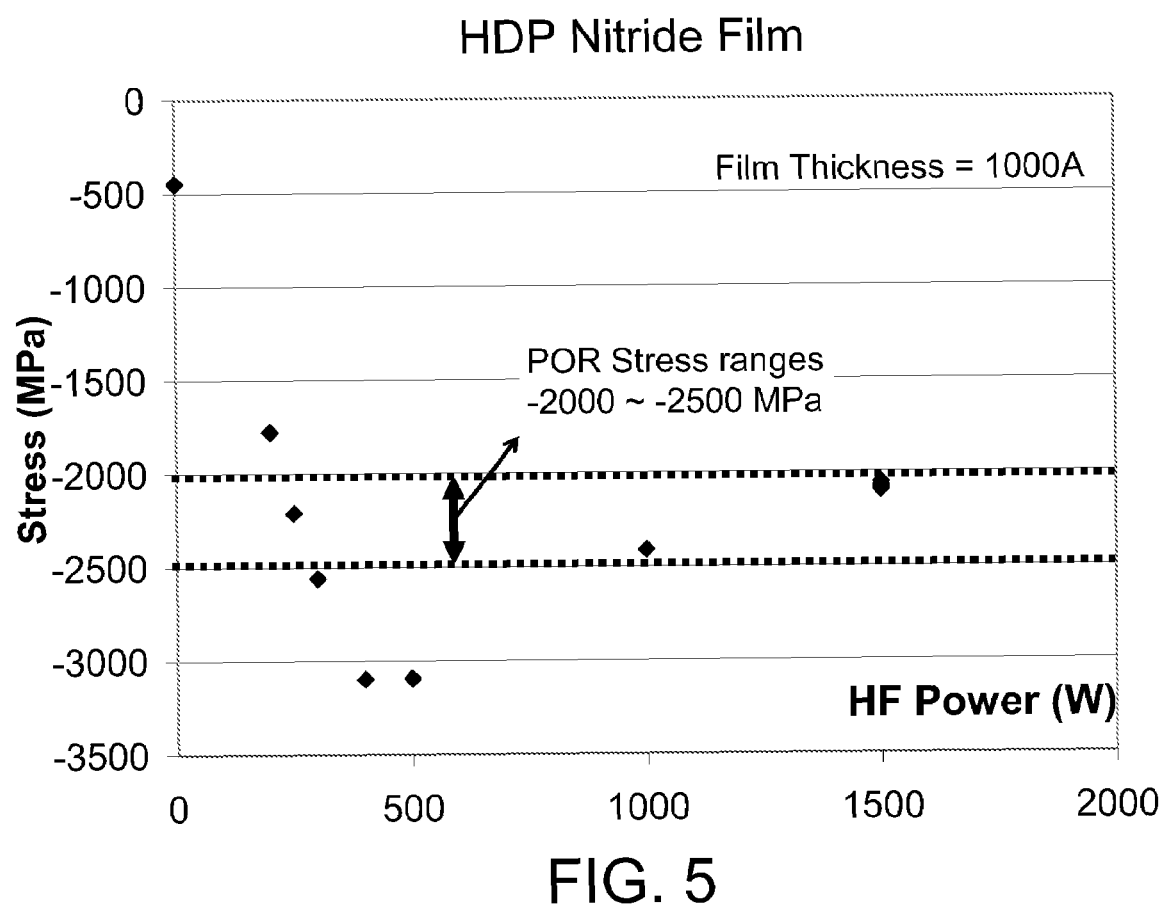
FIG. 5 is a graphical illustration of sample data showing stress levels of compressive nitride films formed at different bias power according to one embodiment of the invention.

FIG. 5 is a graphical illustration of sample data showing compressive stress levels of nitride films formed under different bias power according to one embodiment of the invention. Data shown in FIG. 5 indicates that, in a 300 mm substrate, nitride films of highly compressive stresses may be achieved under a bias power around 400-500 W, or equivalently 0.5~0.6 W/cm$^2$ in power density. This stress level achieved of around −3100 MPa in general is higher than those nitride films obtained under most of other bias conditions. However, it is also known in the art that a nitride film formed at the above bias power conditions, namely 400-500 W which is mainly designed for achieving high stress levels, may inadvertently cause the formation of seams in the film produced, particularly in regions or areas around where the underlying gate devices exhibit noticeable structural changes. In addition to the formation of seams, pinch-offs and related voids may also occur in regions between neighboring gate devices as described above with reference to FIG. 2.

As shown in FIG. 5, a reasonable level of compressive stress, namely between −2000 MPa and −2500 MPa, may be achieved when a substrate is biased at a HF power between 900 W-1500 W. Process of record (POR) also indicates that compressive stress of between −2000 MPa and −2500 MPa are typically used for fabricating 300 mm substrate device. According to one embodiment of the present invention, a method may include applying a higher (than conventional) bias power to a substrate in a HDP deposition process to create a nitride film which may be less conformal when being compared with a film formed by a conventional PECVD process. The nitride film formed at this higher (than conventional) bias power may be seamless as well as void-less while still possessing a relatively high compressive stress.

According to one embodiment, the level of stress of the HDP nitride film may be tuned by applying different biased power and/or by varying the bias power during the deposition process. For example, at a bias power of 1500 W, the stress level created in the HDP nitride film may be very similar to the stress of a POR film, which is −2000 MPa and may be suitable for one application such as, for example, a 90 nm technology node application. Also, a 900 W bias power may be suitable for creating a nitride film that works for another project such as, for example, a 65 nm technology node. According to one embodiment, varying bias power levels between, for example 250 W and 1200 W for a 200 mm substrate, may be employed to create a dual layer nitride film with a combined stress level around, for example, −2200 MPa.

Table 1 provides a demonstrative list of nitride films (SiN) formed on a 300 mm substrate in a HDP process under different high frequency bias power conditions.

TABLE 1

| Sample ID | HF Power (W) | Thickness (Å) | Unit (% 1-sigma) | RI | RI (% 1-sigma) | GOF | Stress (MPa) |
|---|---|---|---|---|---|---|---|
| 1 | 500 | 1022 | 2.44 | 1.9644 | 0.2332 | 0.9890 | −3095 |
| 2 | 1000 | 1095 | 2.00 | 1.9054 | 0.4725 | 0.9890 | −2413 |
| 3 | 1500 | 1092 | 2.03 | 1.8823 | 0.5709 | 0.9890 | −2057 |
| 4 | 1500 | 1092 | 1.90 | 1.8853 | 0.4816 | 0.9900 | −2076 |
| 5 | 1500 | 1088 | 1.92 | 1.8873 | 0.4657 | 0.9900 | −2098 |
| 6 | 1500 | 1089 | 2.01 | 1.8874 | 0.4313 | 0.9900 | −2089 |
| 90 nm POR @ 0.6 Torr Comp. PECVD film | | 1130 | 2.5 | 1.9334 | | | −2040 |
| Alternative PECVD film @ 2.1 Torr Comp. | | 1200 | 1.3 | 1.9370 | | | −2030 |

According to one embodiment of the invention, a gate structure may be initially covered by an unbiased HDP nitride film, such as a SiN film. A biased HDP nitride film, or a nitride film produced under a bias power condition, may then be formed on top of the unbiased nitride film of SiN at a power level that is higher than the conventional range of 400-500 W (for a 300 mm substrate). For example, in order to match a compressive stress of −2000 MPa of a nitride film produced by a process of record, a bias power of around 1500 W (2.1 W/cm$^2$) may be used. A HDP nitride film formed under this bias power condition may have significantly reduced seams and less or no pitch-offs when compared with those formed under a condition of a bias power of 400-500 W (0.5~0.6 W/cm$^2$) that are mainly designed to create highly compressive stress in the film formed.

According to one embodiment of the invention, the formation of compressive nitride film may be carried out in a 300-mm Novellus Speed HDP chemical vapor deposition tool available from Novellus Systems, Inc. However, the invention is not limited in this respect and other HDP chemical vapor deposition tools may be used. In one embodiment, silane, argon and nitrogen may be used as sputtering source gases, with flow rates being maintained at, for example, 230 sccm and 310 sccm respectively during the process for 300-mm substrate applications. However, the invention is not limited in this respect and other flow rates may be used as well. During the sputtering process the substrate temperature may be kept at, for example, about 375-440° C., preferably about 400-420° C., and the gas pressure may be maintained at less than 10 mTorr. Other substrate temperatures and gas pressures may be used as well. The low frequency (LF) power may be kept at, for example, 3600 W. The high frequency (HF) bias power may be maintained at around, for example, 2000 W. However, the invention is not limited in this respect either. The low frequency power and high frequency bias power may be applied at different levels for different wafer sizes and at different processing stages. According to one embodiment of the invention, the low frequency main power and high frequency bias power may be set according to the following table 2.

TABLE 2

| Tool sets | HF RF (Bias) Power | LF RF Power |
|---|---|---|
| HDP nitride (300 mm) | 600-3600 W | 2500-4000 W |
| HDP nitride (200 mm) | 250-1600 W | 1500-2000 W |

The bias power is characterized as a high-frequency power source, typically supplied by an RF generator of a frequency between 12 MHz to 15 MHz. According to one embodiment, the RF generator is at 13.56 MHz frequency although other frequency may be used. The low frequency main power has a typical frequency around 400 kHz although other frequency may be used as well.

According to yet another embodiment of the invention, varying levels of bias power density may be applied to a substrate during the process of forming a compressive stress nitride film. For example, during forming a nitride film over gate devices fabricated on a substrate of 300 mm, or 300 mm diameter size, a high frequency bias power of varying density levels between 0.6 W/cm$^2$ and 5.0 W/cm$^2$ may be employed. Although a power density level between 0.6 W/cm$^2$ and 5.0 W/cm$^2$ is preferable, the invention is not limited in this respect and a lower bias power such as, for example, 400 W (or even lower) bias power may be used in an initial stage of forming the nitride film. The use of an initially lower bias power, e.g., <400 W (0.5 W/cm$^2$), may enable the creation of a initial layer of highly compressive nitride film to prevent possible damages (physical and/or electrical) to the gate devices underneath. The bias power or power density may be subsequently ramped up later in order to create a film that is void-free and seamless.

Figure 6:
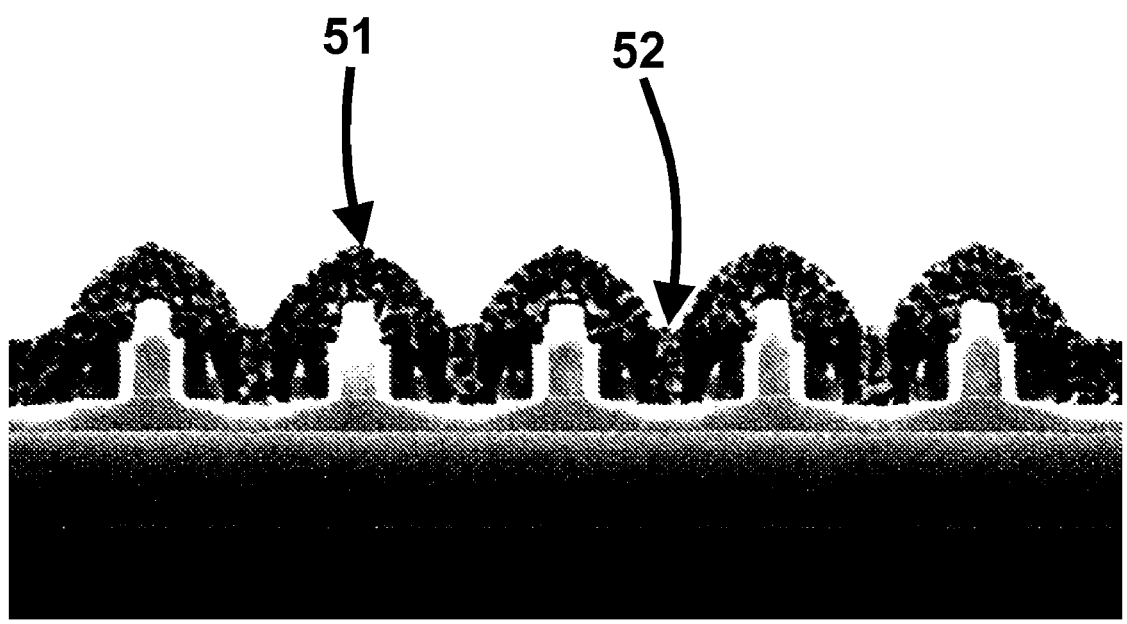
FIG. 6 is an image of scanning electron microscope showing sample PFET gates covered by a compressive nitride film formed according to one embodiment of the invention.

FIG. 6 is an image of scanning electron microscope (SEM) illustrating sample PFET gate devices covered by a compressive nitride film according to one embodiment of the invention. FIG. 6, taken from the scanning electron microscope (SEM), shows a compressive nitride film 51 formed on a 300 mm substrate under a high frequency bias power of 800 W, or 1.1 W/cm$^2$ in power density. The SEM image does not show any voids being formed in high aspect ratio areas, e.g., region 52 between neighboring gate devices. Further, surface topography of the nitride film demonstrates a relatively open and gap-fill friendly "V" shape, which is highly advantageous for subsequent device processing such as, for example, a pre-metal dielectric (PMD) oxide film processing.

Figure 7:
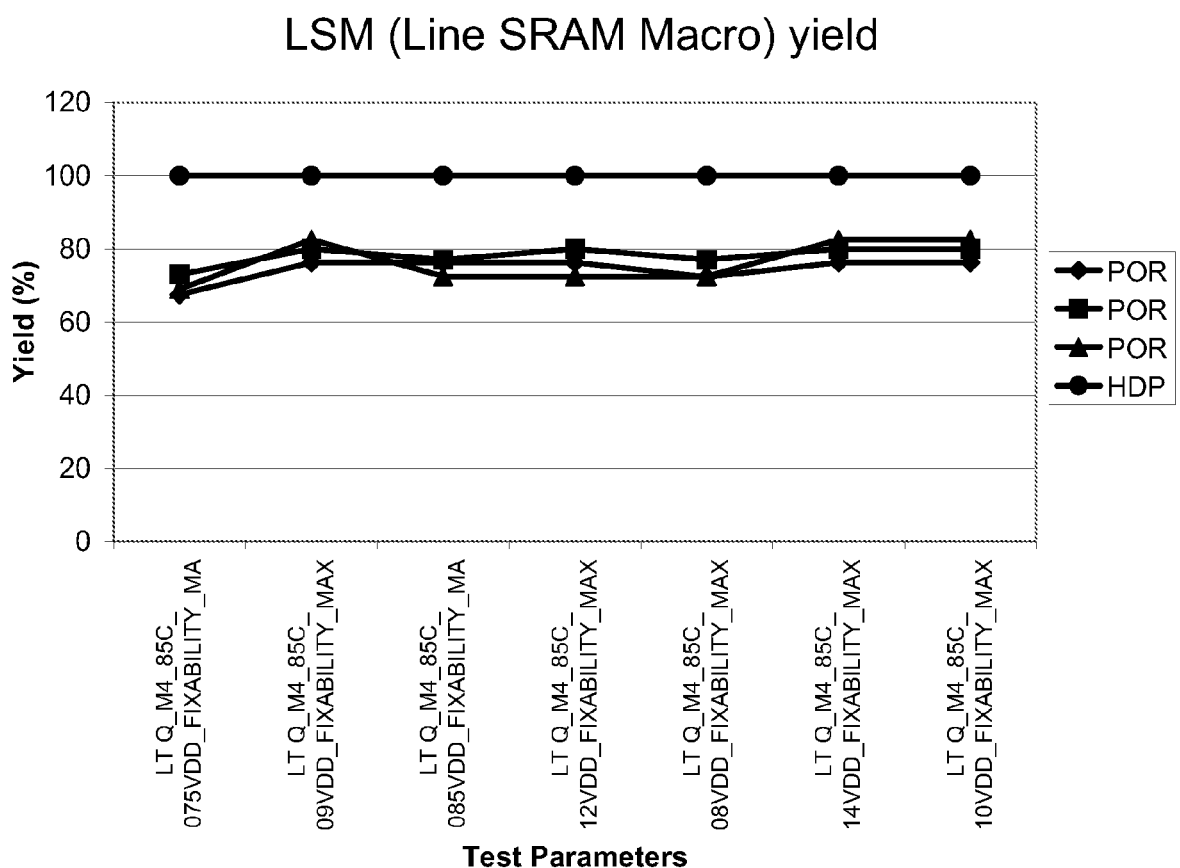
FIG. 7 is a graphical illustration of some sample data showing yield improvement of PFET gates with compressive films formed according to embodiments of the invention.

FIG. 7 is a graphical illustration of some sample data showing yield improvement of PFET gate devices covered by compressive nitride films according to embodiments of the invention. FIG. 7 demonstrates that with gate devices covered by compressive nitride films which are deposited or formed according to embodiments of the invention at higher bias power, fixable yields (indicated by y-axis) of the gate devices, under various different test parameters (indicated by x-axis), improve to close to or near 100%. This yield improvement is significant and compares well with all other three nitride films which are formed according to POR, for example through a PECVD method, whose yields range between 68% and 82%.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming a compressive stress nitride film, the method comprising:
    creating a plurality of gate structures of p-type field effect transistors on a substrate;
    placing said gate structures inside a high-density plasma environment;
    applying a high frequency bias power of varying densities ranging from about 0.8 W/cm$^2$ to about 4.0 W/cm$^2$ to said substrate;
    depositing said high-density plasma to form said compressive stress nitride film covering said gate structures; and
    forming said compressive stress nitride film at a higher rate in a dense poly-contact area between two adjacent said gate structures than in large open areas at the sides of said gate structures.

2. The method of claim 1, comprising varying said bias power from about 1.4 W/cm$^2$ to about 2.1 W/cm$^2$ during high-density plasma deposition to form said compressive stress nitride film void-free.

3. The method of claim 2, comprising forming said void-free compressive stress nitride film in between said plurality of gate structures.

4. The method of claim 1, comprising creating a surface topography of said compressive stress nitride film that is adapted to subsequent film deposition processes.

5. The method of claim 4, wherein said surface topography has a gap-fill friendly shape that resembles character "V".

* * * * *